US009773708B1

(12) United States Patent
Zhang et al.

(10) Patent No.: US 9,773,708 B1
(45) Date of Patent: Sep. 26, 2017

(54) DEVICES AND METHODS OF FORMING VFET WITH SELF-ALIGNED REPLACEMENT METAL GATES ALIGNED TO TOP SPACER POST TOP SOURCE DRAIN EPI

(71) Applicant: GLOBALFOUNDRIES Inc., Grand Cayman (KY)

(72) Inventors: John Zhang, Altamont, NY (US); Steven Bentley, Menands, NY (US); Kwan-Yong Lim, Niskayuna, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/245,634

(22) Filed: Aug. 24, 2016

(51) Int. Cl.
| | | |
|---|---|---|
| H01L 21/8238 | (2006.01) |
| H01L 29/786 | (2006.01) |
| H01L 29/423 | (2006.01) |
| H01L 29/49 | (2006.01) |
| H01L 29/06 | (2006.01) |
| H01L 29/167 | (2006.01) |
| H01L 29/66 | (2006.01) |
| H01L 27/092 | (2006.01) |

(52) U.S. Cl.
CPC ........ *H01L 21/823828* (2013.01); *H01L 21/823807* (2013.01); *H01L 21/823814* (2013.01); *H01L 21/823878* (2013.01); *H01L 21/823885* (2013.01); *H01L 27/092* (2013.01); *H01L 29/0653* (2013.01); *H01L 29/167* (2013.01); *H01L 29/42392* (2013.01); *H01L 29/4966* (2013.01); *H01L 29/66545* (2013.01); *H01L 29/78618* (2013.01); *H01L 29/78642* (2013.01); *H01L 29/78696* (2013.01)

(58) Field of Classification Search
CPC ..... H01L 21/823828; H01L 21/823814; H01L 21/823878
See application file for complete search history.

(56) References Cited

U.S. PATENT DOCUMENTS 8,637,849 B2 1/2014 Deligianni et al.
2003/0047749 A1 3/2003 Chaudhry et al.

OTHER PUBLICATIONS

J.M. Hergenrother et al., "The Vertical Replacement-Gate (VRG) MOSFET: A 50-nm Vertical MOSFET with Lithography-Independent Gate Length", IEDM Tech. Digest, pp. 75-78 (1999).

*Primary Examiner* — Thanh V Pham
(74) *Attorney, Agent, or Firm* — Heslin Rothenberg Farley & Mesiti P.C.; Nathan B. Davis (57) ABSTRACT

Devices and methods of fabricating vertical field effect transistors on semiconductor devices are provided. One intermediate semiconductor includes: a substrate, a bottom spacer layer above the substrate, a plurality of fins, wherein at least one fin is an n-fin and at least one fin is a p-fin; a high-k layer and a work function metal over the bottom spacer layer and around the plurality of fins; a top spacer above the high-k layer and the work function metal and surrounding a top area of the fins; a top source/drain structure over each fin; a dielectric capping layer over the top source/drain structure; a fill metal surrounding the work function metal; and a liner.

19 Claims, 13 Drawing Sheets

DEVICES AND METHODS OF FORMING VFET WITH SELF-ALIGNED REPLACEMENT METAL GATES ALIGNED TO TOP SPACER POST TOP SOURCE DRAIN EPI

FIELD OF THE INVENTION

The present invention relates to semiconductor devices and methods of fabricating semiconductor devices, and more particularly, to devices and methods of forming vertical FETs with self-aligned metal gates aligned to a top spacer following top source drain epitaxial growth.

BACKGROUND OF THE INVENTION

For 5 nm and beyond nodes, with the continually increasing demand for smaller circuit structures and faster device performance, the need for increased current density has resulted in the development of vertical field effect transistors (VFETs). However, realization of VFETs with replacement metal gate (RMG) structures is complex, due to the placement of the gate structure below the source and drain structure, greatly increasing the complexity of these structures and limiting the thermal budgets of the resultant devices.

Therefore, it is desirable to develop methods of fabricating VFET structures which enable the integration of replacement gate structures at high density.

BRIEF SUMMARY

The shortcomings of the prior art are overcome and additional advantages are provided through the provisions, in one aspect, a method that includes, for instance: obtaining an intermediate semiconductor device having a substrate, a bottom spacer layer above the substrate, a plurality of fins, wherein at least one fin is an n-fin and at least one fin is a p-fin, and a set of vertical hardmasks disposed over each fin; depositing a sacrificial dielectric layer and a thin sacrificial gate layer over the plurality of fins and the bottom spacer layer; depositing an interlayer dielectric material between the plurality of fins and planarizing a top surface of the intermediate structure to a top surface of the set of vertical hardmasks; forming a top spacer in the interlayer dielectric material surrounding a top surface of the fins; providing a semiconductor material over each fin to form a top source/drain structure; depositing a dielectric capping layer over the top source/drain structure; removing the interlayer dielectric material, the sacrificial dielectric layer, and the thin sacrificial gate layer, and depositing a high-k layer adjacent the plurality of fins, a work function metal, and a fill metal between the fins; and recessing the fill metal between the plurality of fins and depositing a liner.

In another aspect, an intermediate device is provided which includes, for instance: a substrate, a bottom spacer layer above the substrate, a plurality of fins, wherein at least one fin is an n-fin and at least one fin is a p-fin; a high-k layer and a work function metal over the bottom spacer layer and around the plurality of fins; a top spacer above the high-k layer and the work function metal and surrounding a top area of the fins; a top source/drain structure over each fin; a dielectric capping layer over the top source/drain structure; a fill metal surrounding the work function metal; and a liner dielectric before filling with another interlayer dielectric material and completing the contacts to the device.

BRIEF DESCRIPTION OF THE SEVERAL VIEWS OF THE DRAWINGS

One or more aspects of the present invention are particularly emphasized and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for vertical field effect transistors (VFETs) with self-aligned replacement metal gates aligned to a top spacer after top source/drain epitaxial growth.

Figure 1:
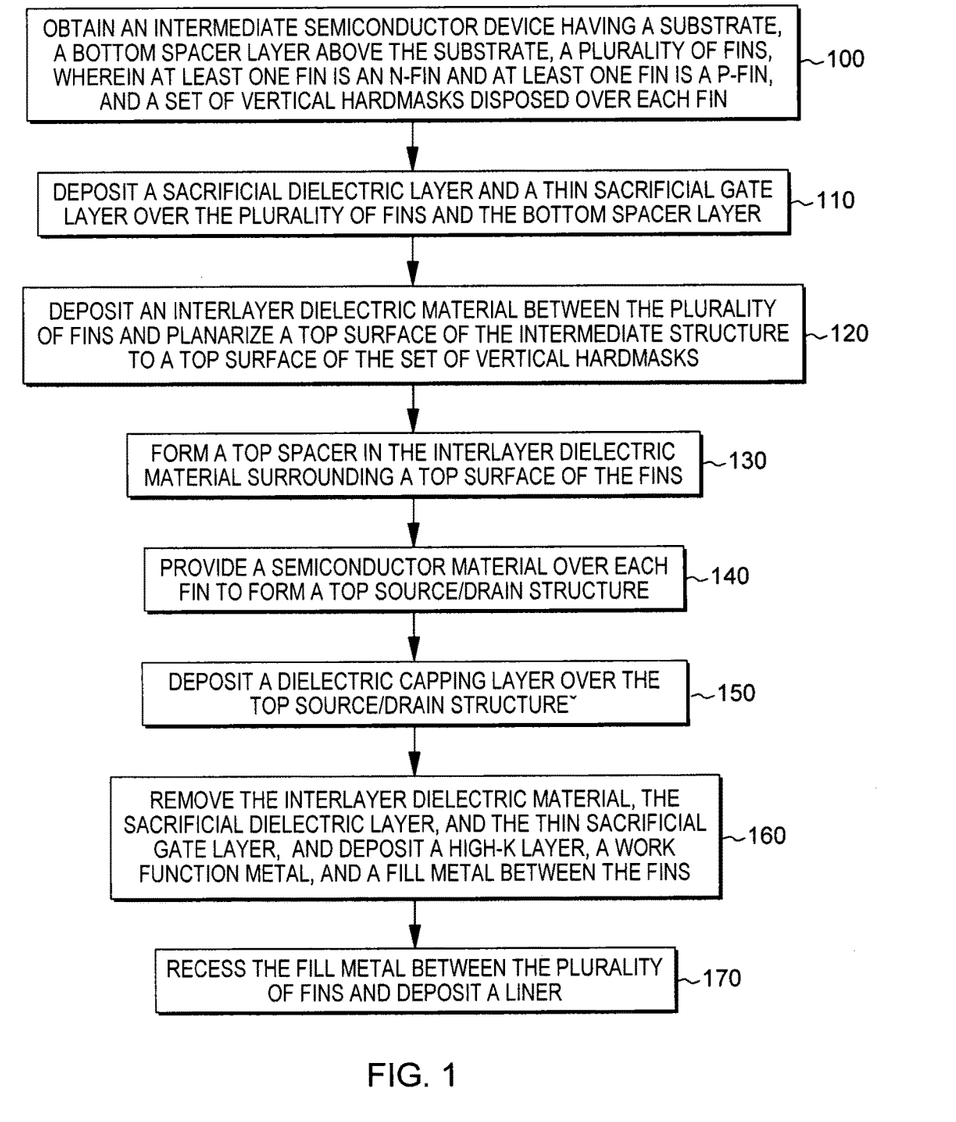
FIG. 1 depicts one embodiment of a method for forming an intermediate semiconductor structure, in accordance with one or more aspects of the present invention.

In one aspect, according to one embodiment, as shown in FIG. 1, an integrated circuit device formation process in accordance with one or more aspects of the present invention may include, for instance: obtaining an intermediate semiconductor device having a substrate, a metal layer disposed thereon, a bottom spacer layer above the metal layer, a plurality of fins, wherein at least one fin is an n-fin and at least one fin is a p-fin, and a set of vertical hardmasks disposed over each fin 100; depositing a sacrificial dielectric layer layer and a thin sacrificial gate layer over the plurality of fins and the bottom spacer layer 110; depositing an interlayer dielectric material between the plurality of fins and planarizing a top surface of the intermediate structure to a top surface of the set of vertical hardmasks 120; forming a top spacer in the interlayer dielectric material surrounding a top surface of the fins 130; providing a semiconductor material over each fin to form a top source/drain structure 140; depositing a dielectric capping layer over the top source/drain structure 150; removing the interlayer dielectric material, the sacrificial dielectric layer, and the thin sacrificial gate layer, and depositing a high-k layer, a work function metal, and a fill metal between the fins 160; and recessing the metal between the plurality of fins and depositing a liner 170.

FIGS. 2-12 depict, by way of example only, one detailed embodiment of a portion of a semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2:
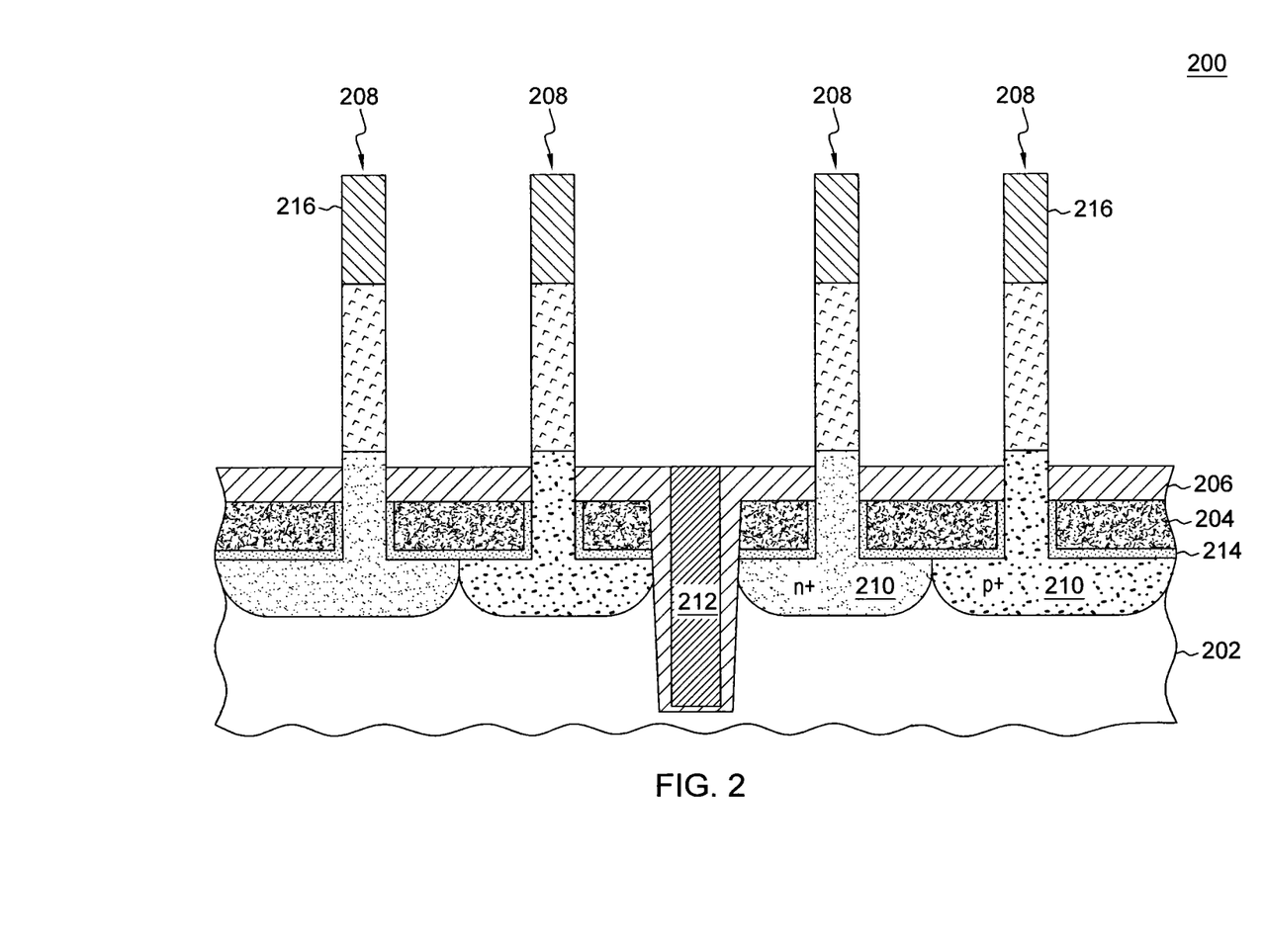
FIG. 2 depicts a cross-sectional elevation view of one embodiment of an intermediate semiconductor structure having a substrate, a metal layer disposed thereon, a bottom spacer layer above the metal layer, a plurality of fins, wherein at least one fin is an n-fin and at least one fin is a p-fin, and a set of vertical hardmasks disposed over each fin, in accordance with one or more aspects of the present invention.

FIG. 2 shows a portion of an intermediate semiconductor device generally denoted 200, depicted at an intermediate semiconductor fabrication stage. The device 200 may have been processed through initial device processing steps in accordance with the design of the device 200 being fabricated, and can include a variety of different wafers. The device 200 may include, for instance, a substrate 202. Substrate 202 may include silicon or a doped silicon material. In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a back end of line (BEOL) portion of an integrated circuit (IC).

Still referring to FIG. 2, a metal layer 204 may be disposed on or above the substrate 202. The metal layer is an entirely optional layer and can include any conductive metal, including but not limited to tungsten, tungsten alloys, and copper. Above the metal layer 204 may be a bottom spacer layer 206. The bottom spacer layer 206 can include any dielectric material, including but not limited to silicon oxide, silicon nitride (SiN), SiOCN, SiBCN or SiCO. Extending from the substrate 202 and through the metal layer 204 and the bottom spacer layer 206 are a plurality of fins 208. In some embodiments, the fins 208 may have a substantially rectangular or oval cross-section to form a vertical nanosheet device, or a substantially rectangular, circular or hexagonal cross-section to form a vertical nanowire device. In some embodiments, the fins may be the same material as the substrate 202, or they may be formed of a differing material formed in an intermediate step, including semiconductors such as silicon, germanium, silicon germanium, or other III-V compounds. In some embodiments, at least one fin 208 is an nFIN and at least one fin 208 is a pFIN. This is a result of prior doping of the fin and/or substrate, and in some embodiments, due to the formation of an optional bottom source/drain region 210 below the fin 208. For instance, the source/drain region 210 may be appropriately doped n or p material of the substrate 202, or it may be formed from another material deposited in a prior step. Extending upward may be more doped material, and then above the bottom spacer layer 206, for instance, may be an undoped or low-doped semiconductor material, for instance, silicon with little to no doping.

In some embodiments, a shallow trench isolation (STI) region 212 may be included between at least some of the fins 208. In some embodiments, an STI region 212 may be between a single pFIN 208 and a single nFIN 208. In other embodiments, STI region 212 may be included between sets of fins 208, such as between each pair of fins 208, with one being a pFIN and one being an nFIN.

Additionally, in some embodiments, a diffusion barrier 214 may be included between the substrate 202 and the metal layer 204 or substrate 202, as well as between the plurality of fins 208 and the metal layer 204, as depicted in FIG. 2. The diffusion barrier layer can include any of the silicide materials, such as tungsten silicide ($WSi_x$), or it may be a metal layer such as titanium nitride (TiN).

Still referring to FIG. 2, above each of the plurality of fins 208 may be disposed a vertical hardmask 216, which in some embodiments includes silicon nitride (SiN). Any hardmask material capable of protecting the underlying silicon of the fins 208 through etching and deposition processes may be used in place of SiN.

Figure 3:
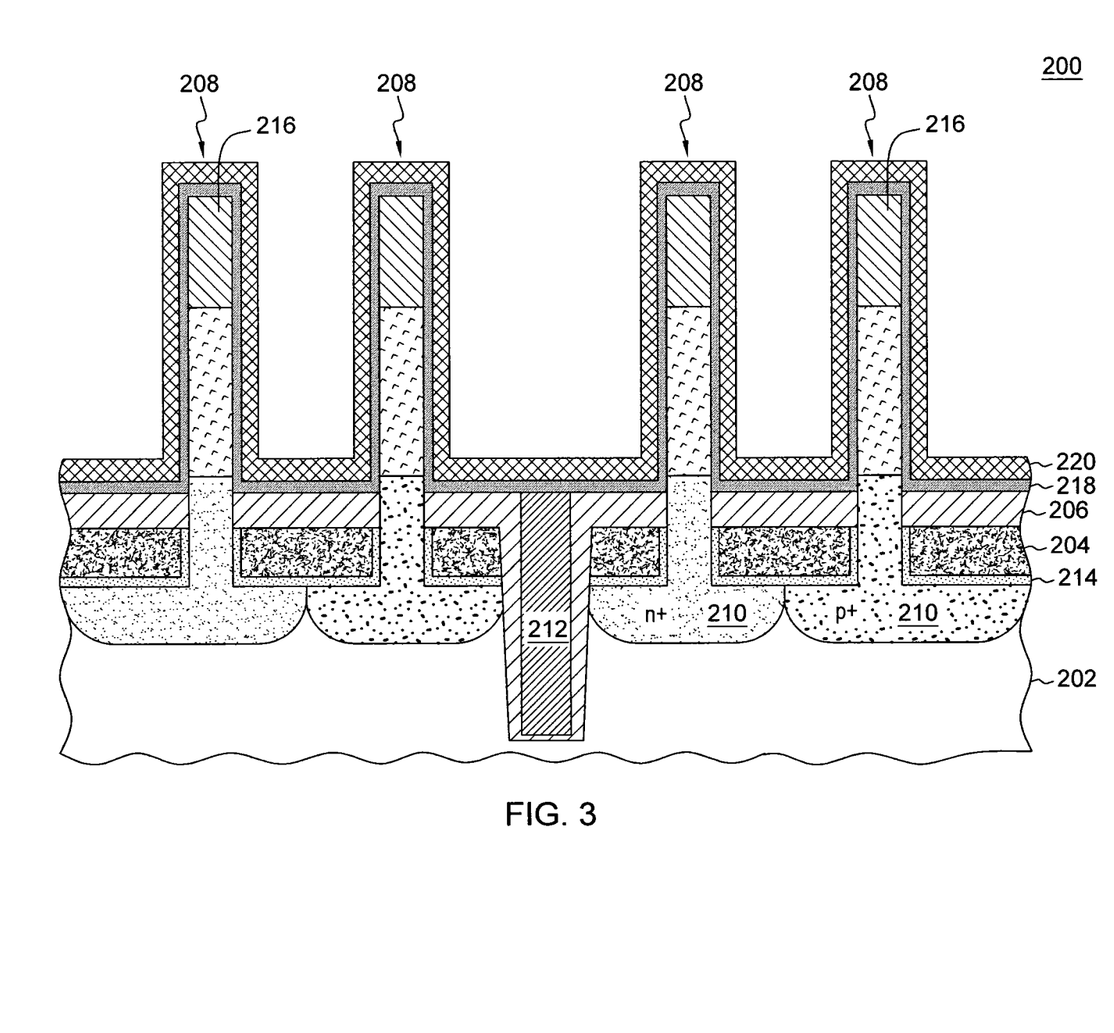
FIG. 3 depicts the structure of FIG. 2 after depositing a sacrificial dielectriclayer and a thin sacrificial gate layer over the plurality of fins and the bottom spacer layer, in accordance with one or more aspects of the present invention.

As depicted in FIG. 3, a sacrificial dielectric layer 218, such as a silicon oxide layer, and a thin sacrificial gate layer 220, in some embodiments an amorphous silicon material, are deposited, conformally, over the plurality of fins 208, including the set of vertical hardmasks 216, and the bottom spacer layer 206. Accordingly, sacrificial dielectric layer 218 covers a top surface of device 200 and is adjacent to the plurality of fins 208, and the thin sacrificial gate layer 220 overlays this. The sacrificial dielectric layer 218 may include any oxide material, and in some instances is considered a dummy oxide as it forms a dummy gate. The thin sacrificial gate layer 220 can include, for instance, silicon, amorphous silicon, silicon containing materials, or a carbon-containing material. Both the sacrificial dielectric layer 218 and the thin sacrificial gate layer 220 may be deposited using atomic layer deposition (ALD) techniques, or alternatively, chemical vapor deposition (CVD), physical vapor deposition (PVD), or any other suitable deposition technique now known or later developed for depositing a thin conformal layer. Their thicknesses can be chosen to control the dimensions of the cavity formed over the fins 208 and hence the dimensions of the top spacers 224 (FIG. 6).

Figure 4:
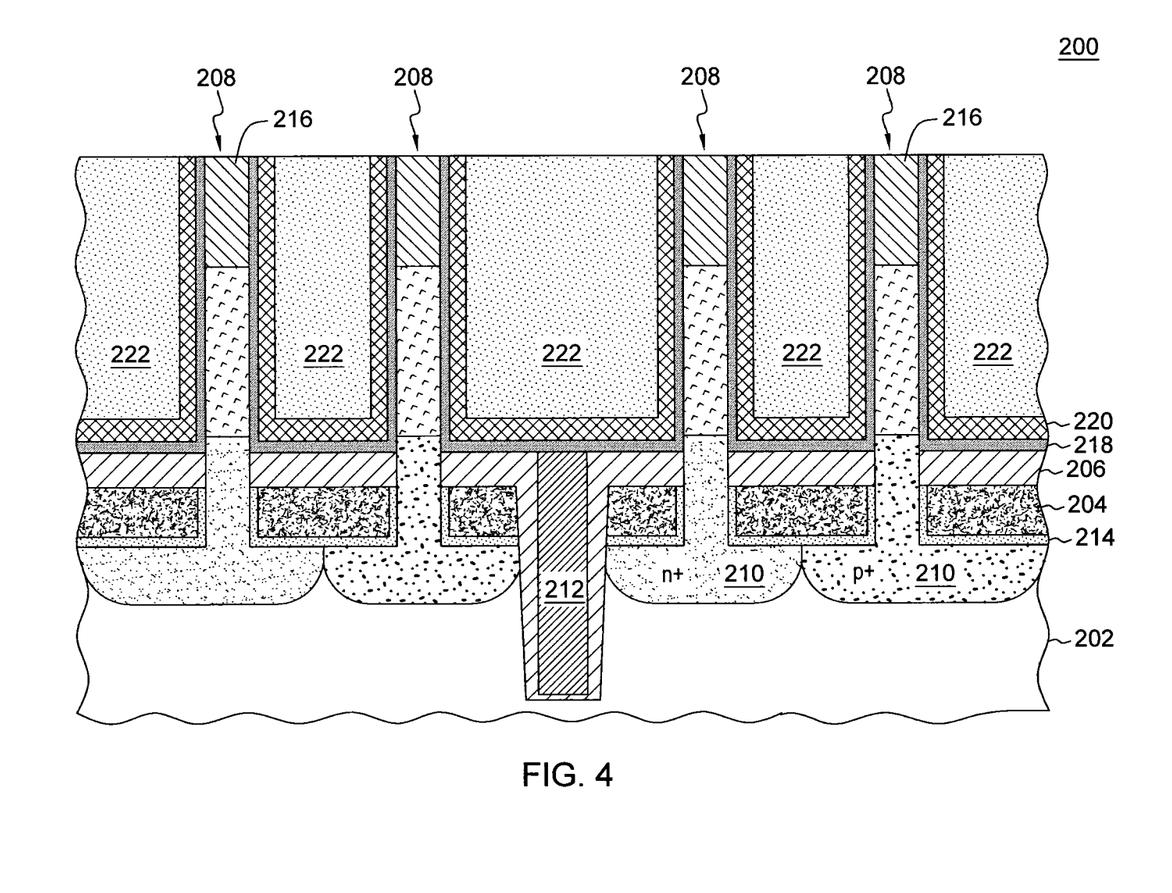
FIG. 4 depicts the structure of FIG. 3 after depositing an interlayer dielectric material between the plurality of fins and planarizing a top surface of the intermediate structure to a top surface of the set of vertical hardmasks, in accordance with one or more aspects of the present invention.

As depicted in FIG. 4, an interlayer dielectric material 222 may be deposited between the plurality of fins 208, thus filling the spaces between fins 208. The interlayer dielectric material may include a flowable silicon oxide. In some embodiments, amorphous silicon can be used in place of the dielectric material 222. Following deposition of the interlayer dielectric material 222, a top surface of the device 200 can be planarized, for instance by chemical-mechanical planarization (CMP) techniques, until the vertical hard mask 216 is reached. The set of vertical hard masks 216 can act as a stop layer for the CMP process.

Figure 5:
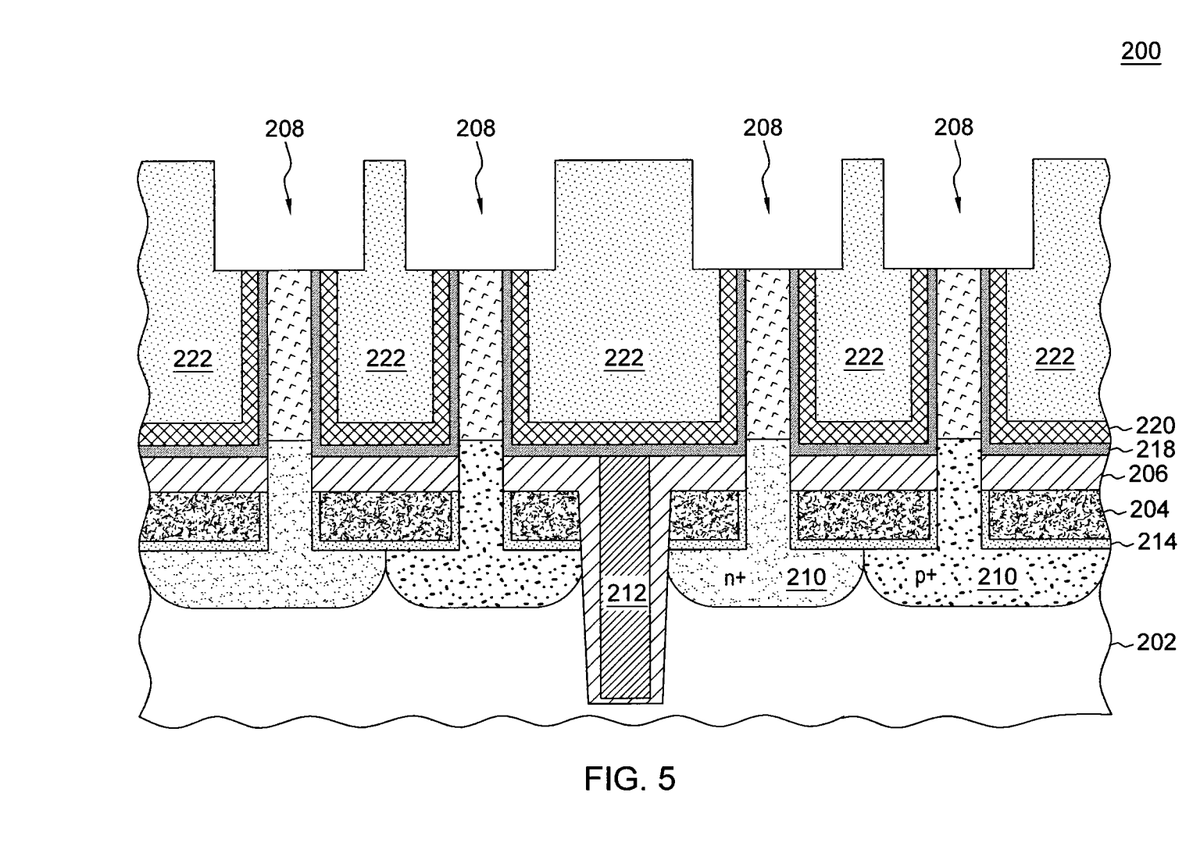
FIG. 5 depicts the structure of FIG. 4 after etching a region surrounding each fin to a top surface of the fins, in accordance with one or more aspects of the present invention.
Figure 6:
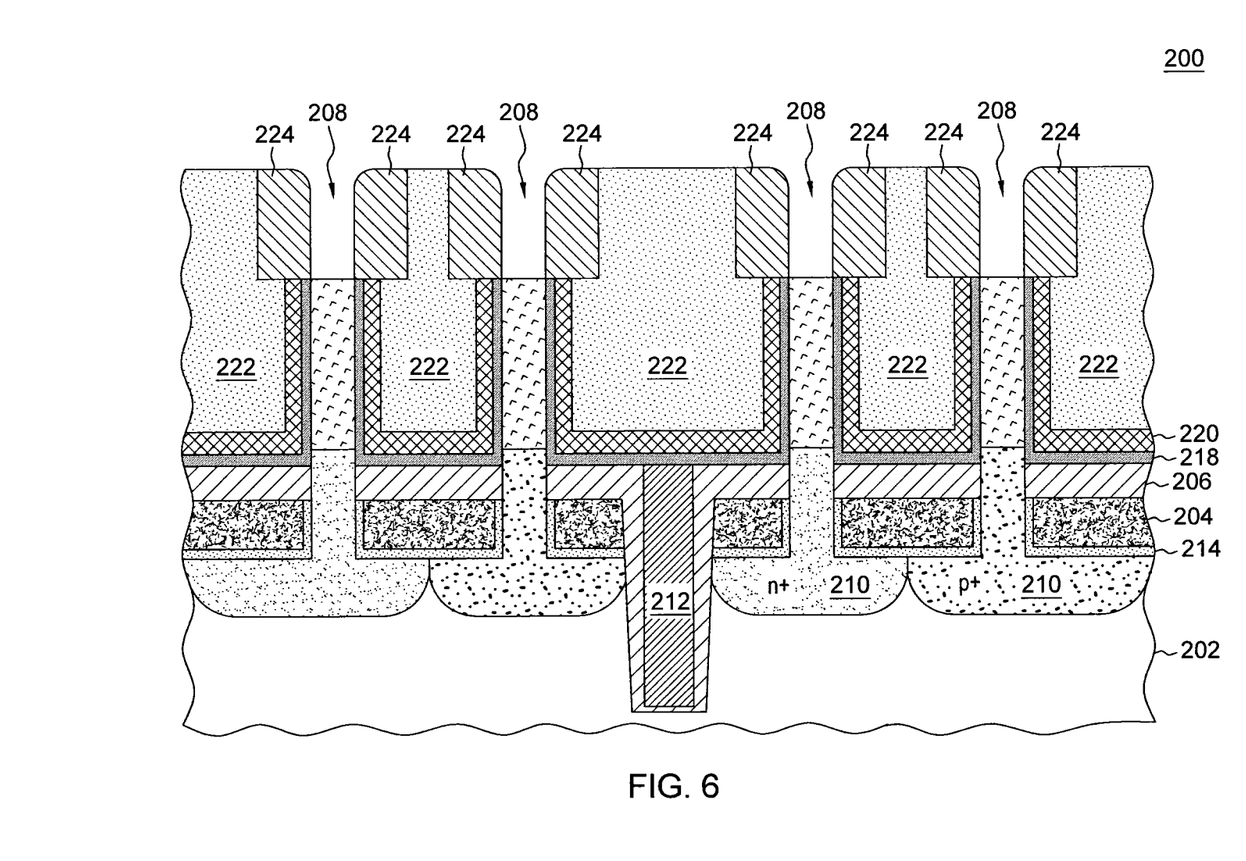
FIG. 6 depicts the structure of FIG. 5 after depositing a top spacer in the region and etching above the vertical spacers to form a top spacer in the oxide, in accordance with one or more aspects of the present invention.

As depicted in FIGS. 5-6, a top spacer 224 can be formed in the interlayer dielectric material 222 surrounding a top surface of set of fins 208. For instance, as depicted in FIG. 5, a region surrounding and above each fin 208 may be etched, using, for instance, reactive ion etching (RIE), as well as wet or dry etching. In some embodiments, multiple etch processes may be used—for example, an RIE process, as shown, will remove the set of vertical hard masks 216, stopping at a top surface of the fins 208, while the sacrificial dielectric layer 218 and the thin sacrificial gate layer 220 in the regions are recessed using selective etching, and some of the surrounding interlayer dielectric material 222 may be removed by a lateral oxide etch as shown in FIG. 5. In some embodiments, there is no lateral etch of the dielectric, and the cavity formed is controlled by the thickness of the sacrificial gate materials. As depicted in FIG. 6, the top spacer 224 may be deposited in the regions using any conformal deposition technique. The top spacer 224 can include any dielectric, including but not limited to silicon nitride (SiN), SiOCN, SiBCN, or SiCO. Following deposition, it can be selectively etched over the fins 208, forming a top spacer 224 on either side of the fins 208 with a cavity directly over the fins 208. In some embodiments, the top spacer 224 should cover any material exposed in the recessed regions except for the amorphous silicon of the fins 208.

Figure 7:
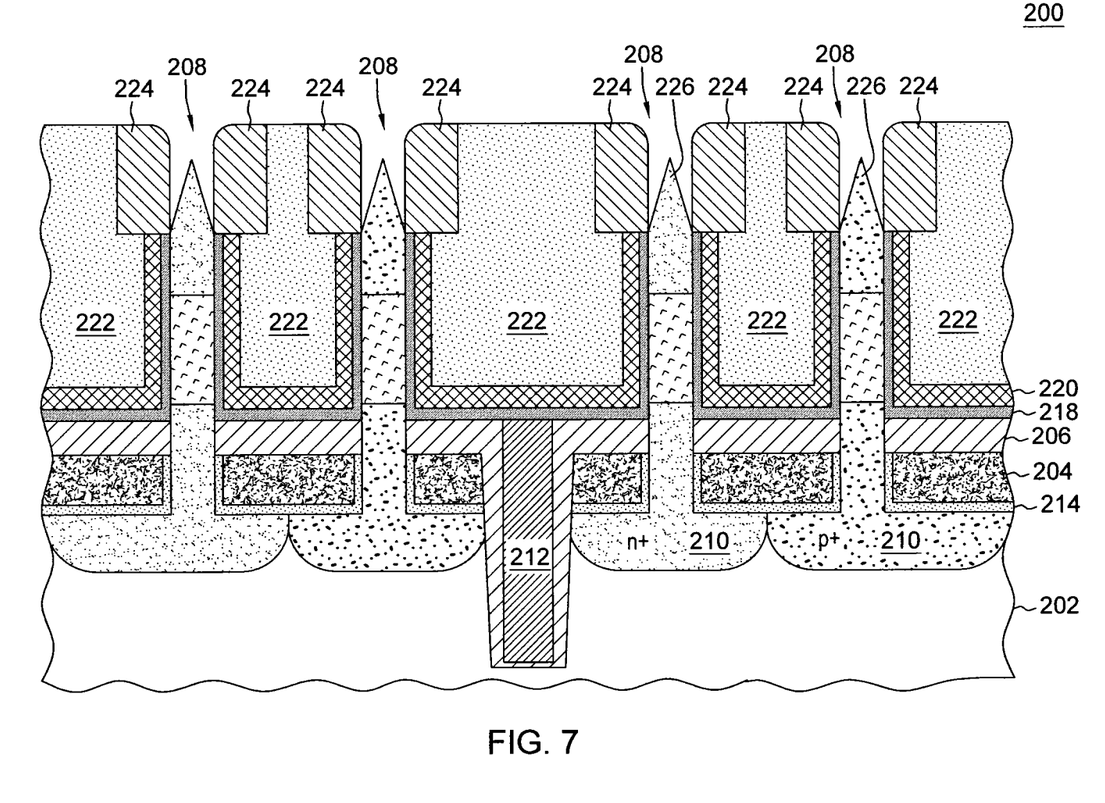
FIG. 7 depicts the structure of FIG. 6 after providing a semiconductor material over each fin to form a top source/drain structure, in accordance with one or more aspects of the present invention.

As depicted in FIG. 7, a semiconductor material may be provided, for instance an epitaxially-grown semiconductor, over the fins 208 to form a top source/drain structure 226. The top source/drain structure 226 may then be separately doped (for example, by ion implant), or it may be doped in situ using epitaxy in order to introduce a set of dopants. In some embodiments, there may be no epitaxial growth, and the top source/drain may be formed by directly doping fin 208. In some embodiments, the dopant may include an n-species for the nFET and a p-species for the pFET. For instance, the nFET source/drain 226 may be doped with phosphorus and the pFET source/drain 226 may be implanted with boron. The doping can, in some embodiments, reach a depth deeper than the top source/drain material 226, doping a portion of the fin 208. In some embodiments, the doping may have a high concentration. In other embodiments, these regions may be doped similarly to a channel region of fin 208.

Figure 8:
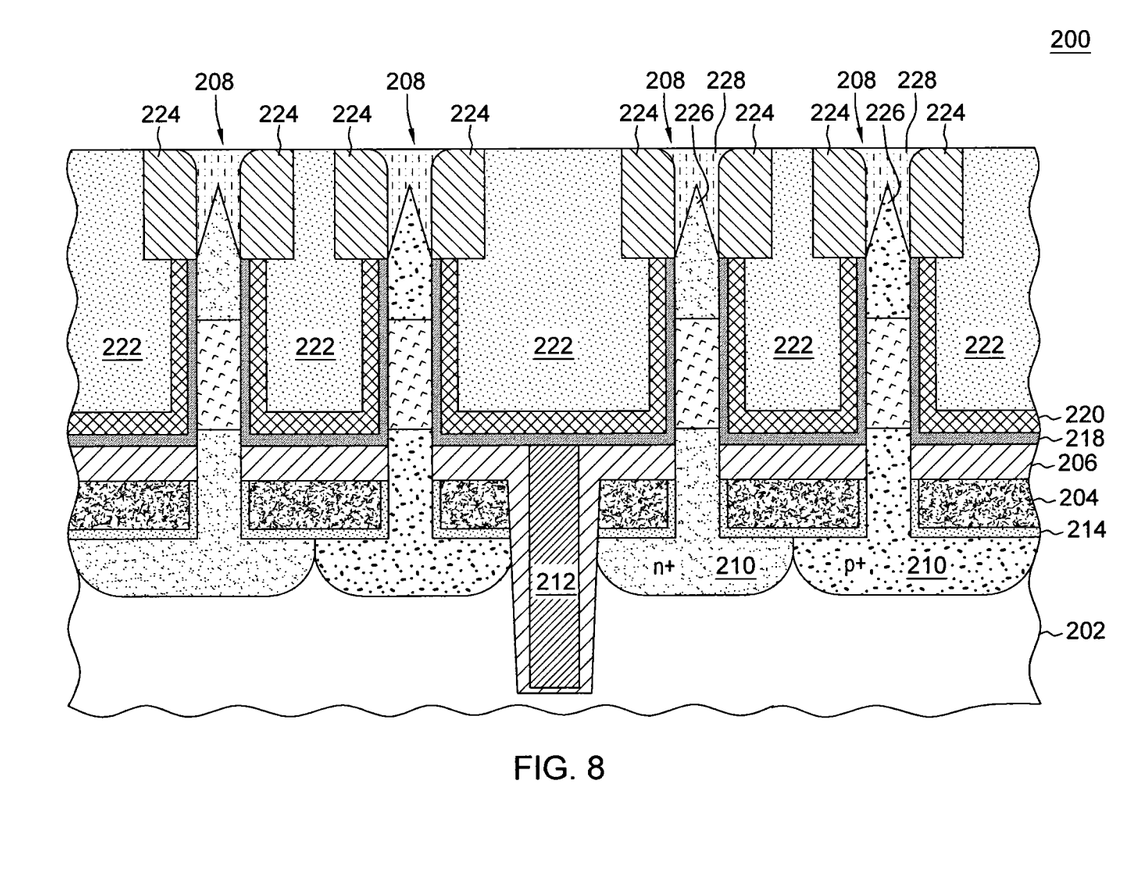
FIG. 8 depicts the structure of FIG. 7 after depositing a dielectric capping layer, such as silicon nitride, over the top source/drain structure, in accordance with one or more aspects of the present invention.

As depicted in FIG. 8, a dielectric capping layer 228 may be deposited over the top source/drain structure 226 to fill any remaining space over the fins 208. The dielectric capping layer 228 may be a single material such as silicon nitride, SiBCN or SICO, or it may be a multi-layer stack. Following deposition of the dielectric capping layer 228, the top surface of the device 200 may then be planarized again to smooth the surface, this time the top spacer 224 and/or the oxide material 222 acting as a natural stop for the planarization.

Figure 9:
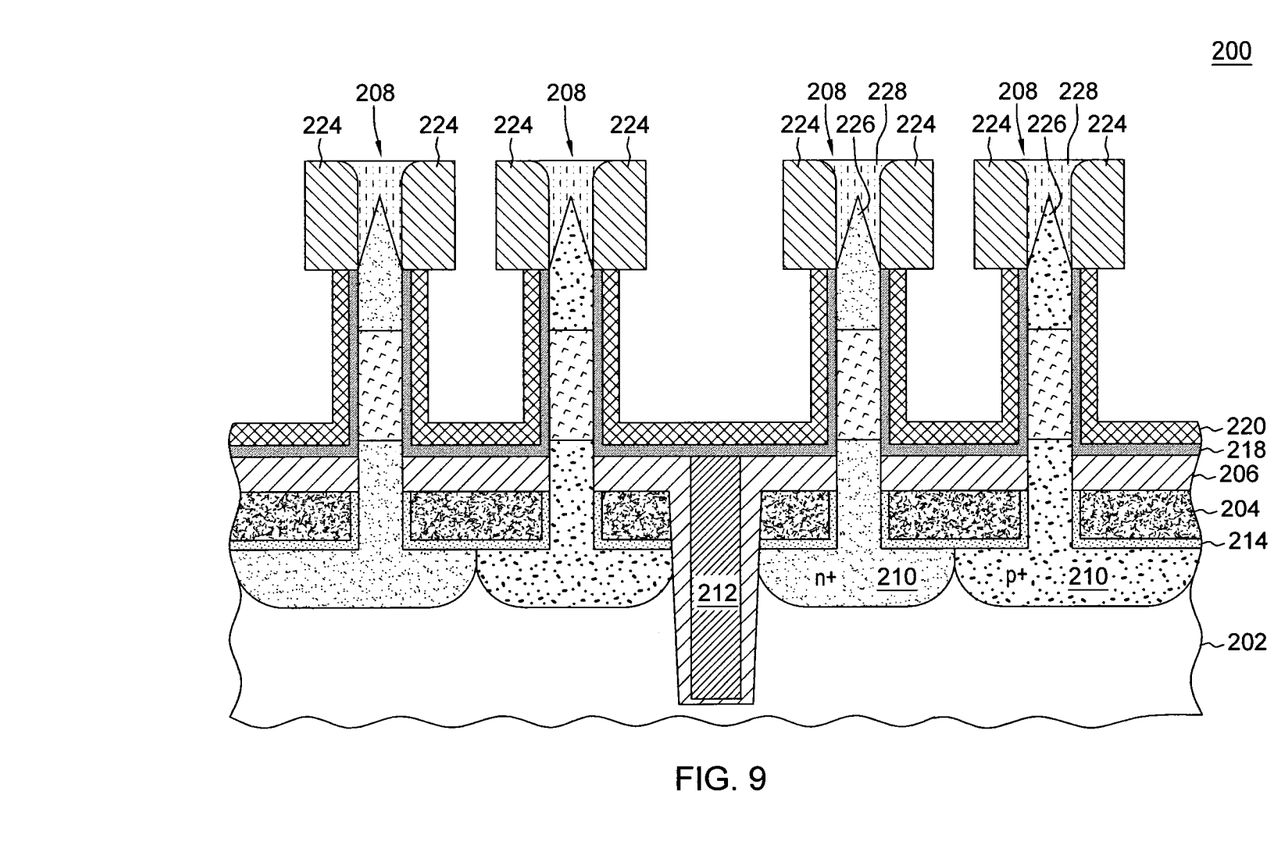
FIG. 9 depicts the structure of FIG. 8 after removing the interlayer dielectric material selectively to the other layers, in accordance with one or more aspects of the present invention.

As depicted in FIG. 9, the interlayer dielectric material 222 may be removed, for instance by buffered oxide etch (BOE), including a buffered hydrofluoric (HF) acid etch, or by chemical oxide removal (COR).

Figure 10:
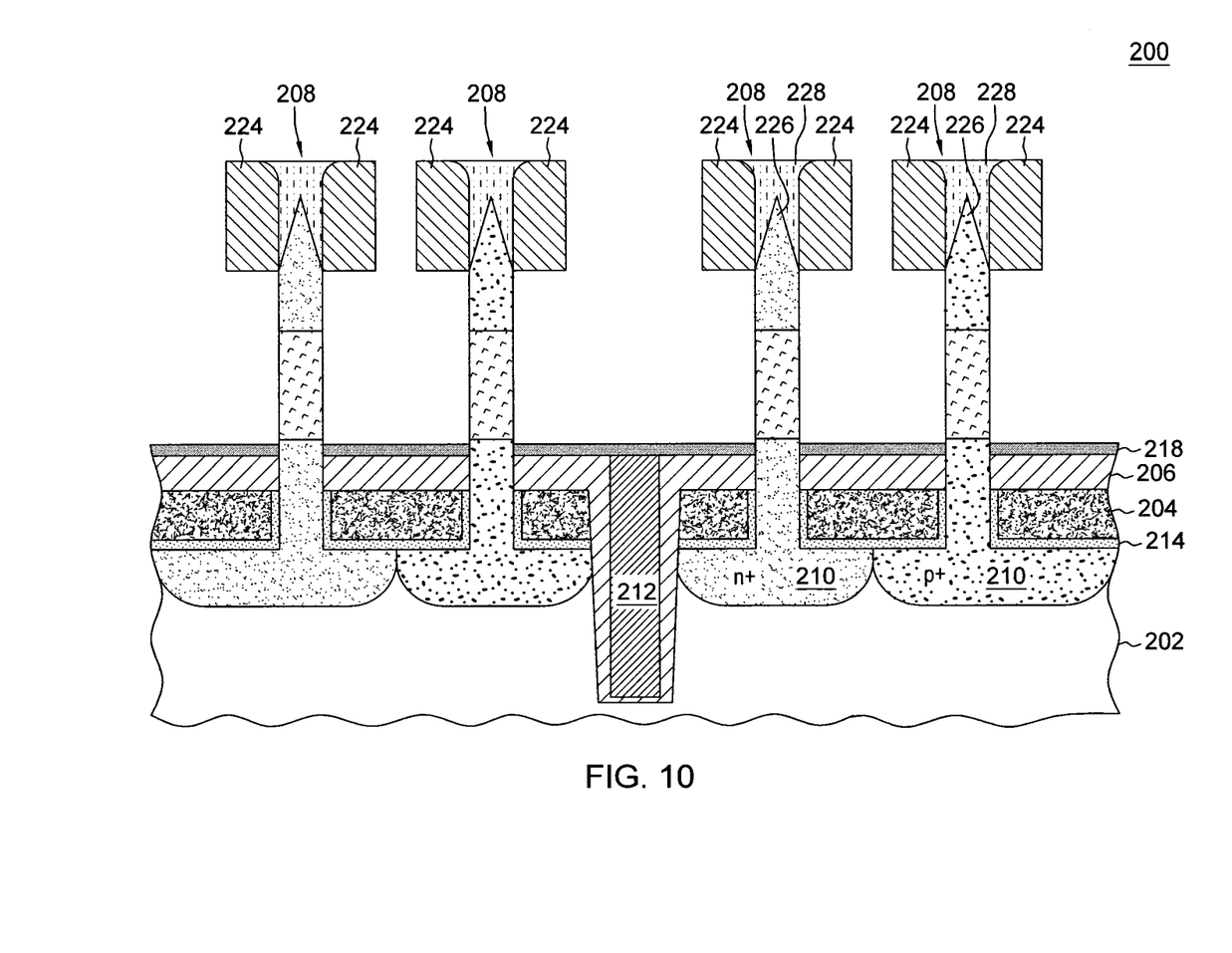
FIG. 10 depicts the structure of FIG. 9 after removing the sacrificial dielectric layer and the sacrificial gate layer, in accordance with one or more aspects of the present invention.

As depicted in FIG. 10, any vertical portions of the sacrificial dielectric layer 218 and some or all of the thin sacrificial gate layer 220 may be removed using a wet etch technique, for instance $NH_4OH$ or buffered HF, or alternatively, can be removed using a dry strip technique. As depicted, the "dummy gate" is removed, leaving the sides of the fins 208 exposed.

Figure 11:
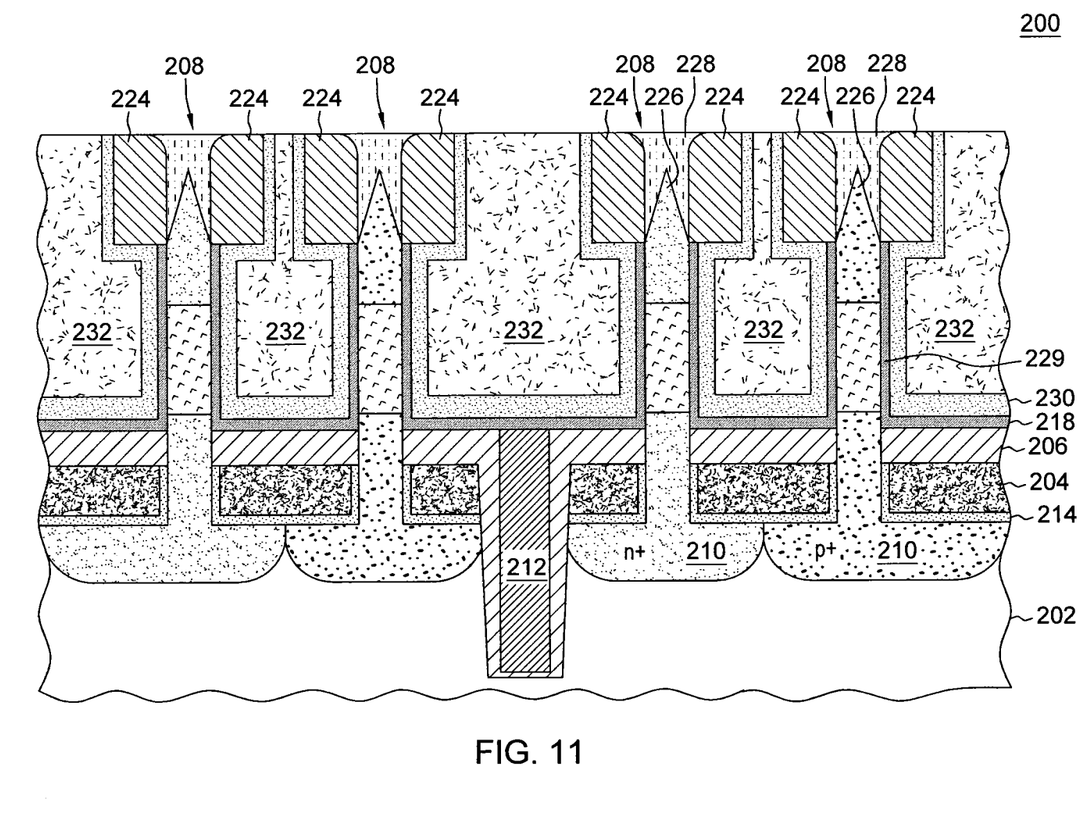
FIG. 11 depicts the structure of FIG. 10 after depositing a high-k layer, a work function metal, and a fill metal between the fins, in accordance with one or more aspects of the present invention.

As depicted in FIG. 11, a high-k layer 229 can be deposited on the vertical sides of the fins 208, covering the exposed sides. Then a work function metal 230 may be deposited, which can include TiN, TaN, TiAlC, or similar materials which can be utilized to further tune device 200. It should be understood that more than one work function material 230 may be used, and multiple layers of materials can be included. Then, a fill metal 232 may be deposited between the plurality of fins 208. In some embodiments, the fill metal may fill gaps between fins 208 up to a bottom surface of the top spacers 224. The fill metal can include tungsten, tungsten alloys, copper, and cobalt, but is not restricted to these metals. Following deposition of these layers, a top surface of device 200 may be planarized using CMP to land on the top spacer 224.

Figure 12:
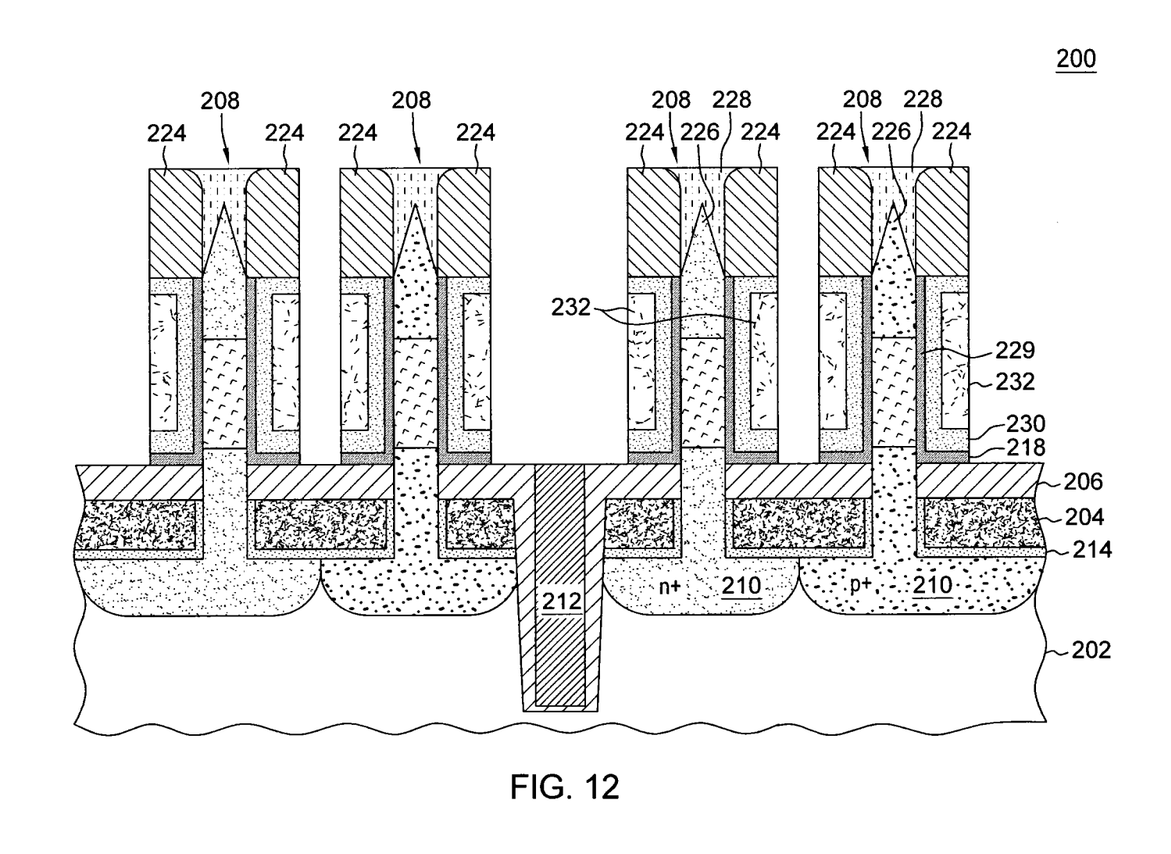
FIG. 12 depicts the structure of FIG. 11 after recessing the metal between the plurality of fins, in accordance with one or more aspects of the present invention.

As depicted in FIG. 12, the fill metal 232 is recessed down, using the bottom spacer 206 as a stop for the recessing, and the top spacers 224 to control the width of the recess, leaving a layer of fill metal 232 on the outside edges of the plurality of fins 208. This reduces the possibility of misalignment, since the process is self-aligned to the fins 208.

Figure 13:
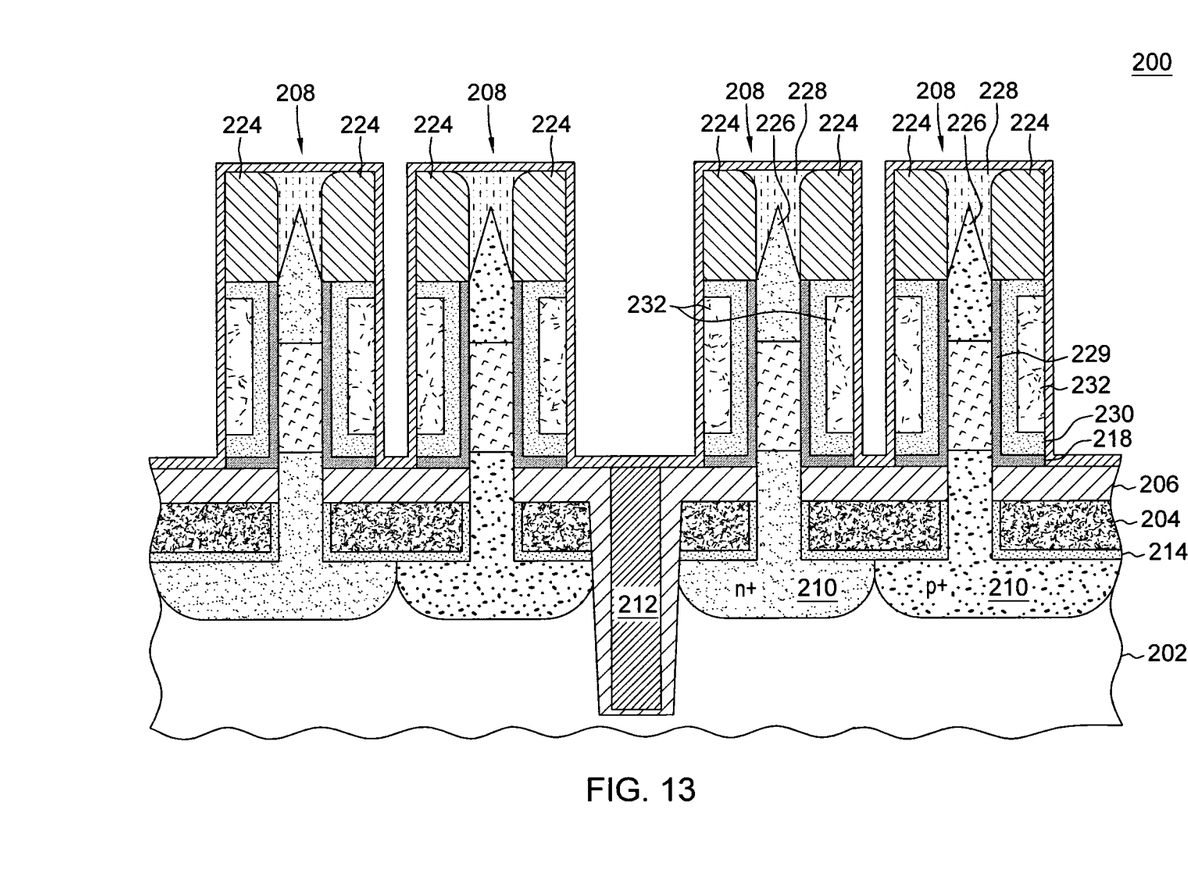
FIG. 13 depicts the structure of FIG. 12 after depositing a liner, in accordance with one or more aspects of the present invention.

As depicted in FIG. 13, a liner 234 is deposited over the entire exposed surface of the device 200. The liner can include, but is not limited to, SiN, SiCO, SiBCN, or related materials, and protects the underlying device through the following process steps. For instance, following the above steps, an interlayer dielectric is again formed over the structure 200, polished back, and contacts may then be formed to the top and bottom source/drains and to the gate, using various known methods.

According to additional embodiments, a structure is disclosed. For instance, as depicted in FIG. 13, an intermediate semiconductor device is shown including a substrate 202, an optional metal layer 204 disposed thereon, a bottom spacer layer 206 above the metal layer 204, a plurality of fins 208, wherein at least one fin is an n-fin and at least one fin is a p-fin, a high-k layer 229 and a work function metal 230 over the bottom spacer layer 206 and around the plurality of fins 208, a top spacer 224 above the thin high-k layer 218 and the work function layer 220 and surrounding a top area of the fins 208, a top source/drain structure 226 over each fin 208, wherein the top source/drain 208 is doped, a dielectric capping layer 228 over the top source/drain structure 226, a fill metal 232 surrounding the work function layer 230, and a liner 234.

It should be appreciated that the novel intermediate semiconductor devices and methods of forming the same disclosed above allow for self-alignment methods, and thus, the use of vertical field effect transistors on a smaller scale then possible before. According to embodiments, the disclosed structure is sturdier than previous attempts and reduces the chances of shorts occurring post-process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining an intermediate semiconductor device having a substrate, a bottom spacer layer above the substrate, a plurality of fins, wherein at least one fin is an n-fin and at least one fin is a p-fin, and a set of vertical hardmasks disposed over each fin;
   depositing a sacrificial dielectric layer and a thin sacrificial gate layer over the plurality of fins and the bottom spacer layer;
   depositing an interlayer dielectric material between the plurality of fins and planarizing a top surface of the intermediate semiconductor device to a top surface of the set of vertical hardmasks;
   forming a top spacer in the interlayer dielectric material surrounding a top surface of the fins;
   providing a semiconductor material over each fin to form a top source/drain structure;
   depositing a dielectric capping layer over the top source/drain structure;
   removing the interlayer dielectric material, the sacrificial dielectric layer, and the thin sacrificial gate layer, and depositing a high-k layer adjacent the plurality of fins, a work function metal, and a fill metal between the fins; and
   recessing the fill metal between the plurality of fins and depositing a liner.

2. The method of claim 1, further comprising:
   providing a shallow trench isolation region between at least some of the fins.

3. The method of claim 1, further comprising:
   providing a diffusion barrier between the substrate and a metal layer and between the fins and the metal layer, the metal layer being above the substrate.

4. The method of claim 1, wherein the interlayer dielectric material comprises a flowable oxide.

5. The method of claim 1, wherein the forming a top spacer comprises:
   etching a region surrounding each fin to a top surface of the fins;
   depositing a top spacer in the region; and
   etching above the vertical spacers.

6. The method of claim 5, wherein the etching the region comprises a dry etch.

7. The method of claim 5, wherein the top spacer comprises SiN, SiCO, SiOCN, or SiBCN.

8. The method of claim 1, further comprising:
   introducing a set of dopants into the top source/drain structure.

9. The method of claim 8, wherein the set of dopants includes phosphorus over each n-fin and boron over each p-fin.

10. The method of claim 1, further comprising:
    planarizing a top surface of the intermediate semiconductor device following depositing the dielectric capping layer.

11. The method of claim 1, wherein the fill metal comprises a tungsten containing metal.

12. The method of claim 1, further comprising:
    stopping the recessing at the bottom spacer.

13. The method of claim 1, wherein the liner comprises SiN, SiCO, or SiBCN.

14. The intermediate semiconductor device of claim 13, further comprising:
    a shallow trench isolation region between at least some of the fins.

15. The intermediate semiconductor device of claim 13, further comprising:
    a diffusion barrier between the substrate and a metal layer and between the fins and the metal layer, the metal layer being above the substrate.

16. The intermediate semiconductor device of claim 13, wherein the top spacer comprises SiN, SiCO, SiOCN, or SiBCN.

17. The intermediate semiconductor device of claim 13, wherein the top source/drain structure includes phosphorus doped silicon over each n-fin and boron doped silicon over each p-fin.

18. The intermediate semiconductor device of claim 13, wherein the fill metal comprises a tungsten containing metal.

19. The intermediate semiconductor device of claim 13, wherein the liner comprises SiN, SiCO, or SiBCN.

* * * * *